May 9, 1967 HANS-NORBERT TOUSSAINT ET AL 3,319,140

PRESSURE SENSITIVE SEMICONDUCTOR DEVICE

Filed Dec. 9, 1964 2 Sheets-Sheet 1

United States Patent Office 3,319,140
Patented May 9, 1967

3,319,140

PRESSURE SENSITIVE SEMICONDUCTOR DEVICE

Hans-Norbert Toussaint, Munich, and Friedrich Krieger, Gilching, Germany, assignors to Siemens & Halske Aktiengesellschaft, Berlin and Munich, Germany, a corporation of Germany Filed Dec. 9, 1964, Ser. No. 417,157
Claims priority, application Germany, Dec. 9, 1963, S 88,651
13 Claims. (Cl. 317—235)

The present invention relates to a pressure sensitive semiconductor device. More particularly, the invention relates to a semiconductor device having a p-n junction and upon which pressure is applied by means of a hard point.

Devices of this type are known and described, for example, in an article entitled, "Highly Sensitive Microphone Uses Transistor as Base," Bell Laboratories Record, December 1962, pages 418–419.

The present invention discloses how, in devices of this type, a particularly high sensitivity may be obtained in a simply constructed design. In accordance with the present invention, a block of semiconductor material, on one hand, forms one zone of a p-n rectifier at an area of the block upon which a point applies pressure, and, on the other hand, the block forms the collector zone of a transistor, at a different area of the block. The other zone of the rectifier is conductively connected to the base zone of the transistor.

A special p-n junction may be provided to transform pressure fluctuations into current fluctuations. Due to the construction and electrical combination of the p-n junction with the transistor, the dimensioning of the p-n junction is facilitated, because only the optimum pressure sensitivity need be considered. A desirable amplifying effect need not be considered because it is produced by a separate transistor. The transistor, however, is not subjected to the pressure or pressure fluctuations and therefore need not be concerned with the pressure.

The device of the present invention comprises a compact component which forms a bipole rectifier and a transistor. The rectifier and the emitter and collector electrodes of the transistor may be connected directly into a circuit by a controllable resistance. This eliminates the need for an additional base current supplied from an outside source to operate the transistor.

In order that the present invention may be readily carried into effect, it will now be described with reference to the accompanying drawings, wherein.

In the figures, the same components are identified by the same reference numerals.

Figure 1:
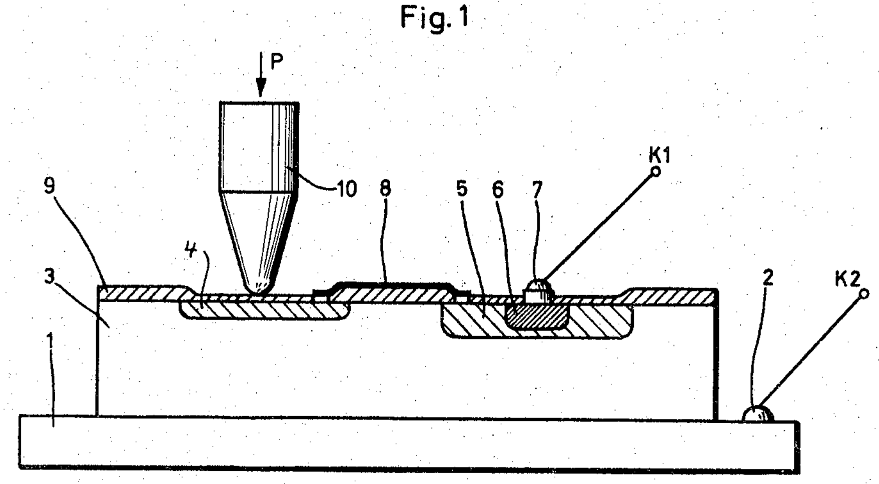
FIG. 1 is a side view, partly in section, of an embodiment of a semiconductor device of the present invention.

In FIG. 1, a block 3 of n-type semiconductor material is supported on a carrier plate 1 having an electrode 2. The semiconductor block 3 comprises one zone of a p-n rectifier having a p conductivity type zone 4. The semiconductor block 3 also comprises the collector zone of an npn transistor having a p conductivity type base zone 5 and an n conductivity type emitter zone 6. An emitter electrode 7 is provided at the emitter zone 6.

An electrically conductive connection is provided between the p conductivity zone 4 of the rectifier and the base zone 5 of the transistor. The electrically conductive connection may be in the form of a vaporized metal layer or layers 8. The surface of the semiconductor block 3 rests on the carrier plate 1, and the appropriate zones of the rectifier and the transistor are covered or coated with a non-conductive protective layer 9, for example, of silicon oxide. The protective layers 9 are penetrated by the conductive connection 8 at the places where said connection is in contact with the zone 4 of the rectifier and with the zone 5 of the transistor.

A hard point 10, preferably of non-conductive material, is positioned approximately at the center of the p conductivity type zone 4 of the rectifier. The point 10 may comprise, for example, sapphire. The point 10 abuts the surface of the zone 4 and applies pressure to the rectifier in the direction of the arrow P.

Figure 2:
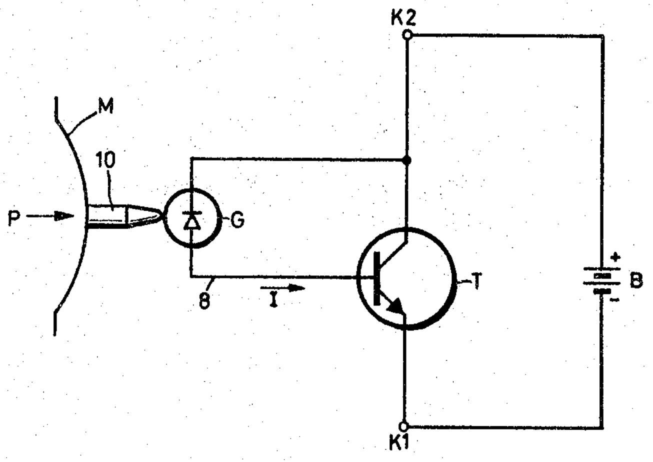
FIG. 2 is a circuit diagram of the embodiment of FIG. 1.

The electrical circuit equivalent for the device of FIG. 1 is shown in FIG. 2. The transistor T and the rectifier G are electrically connected to each other as shown. A battery B is connected between the emitter electrode and the collector electrode of the transistor T. The rectifier G is connected between the base electrode of the transistor T and the collector electrode thereof. The rectifier G is connected via the connection lead 8 to the base electrode of the transistor T in a polarity whereby it is operated in its blocking direction.

Pressure is applied to the rectifier G via the point 10, which may be actuated by a pressure measuring device or by any suitable type of transducer such as, for example, a pressure meter or a microphone. The pressure-responsive device M is suitably coupled to the point 10. The pressure of the point 10 upon the rectifier G, increases the blocking current of said rectifier which flows to the transistor T as the base current of said transistor and thereby controls the operation of the said transistor.

Figure 3:
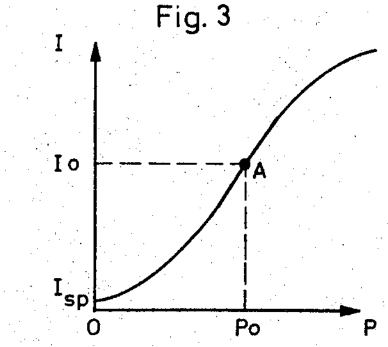
FIG. 3 is a graphical presentation explaining the operation of the device of FIG. 1.

The relationship between the pressure of the point 10 on the rectifier G and the blocking current of said rectifier is graphically illustrated in FIG. 3. The abscissa represents the pressure P and the ordinate represents the current I flowing through the rectifier. As may be seen in FIG. 3, a blocking current $I_{sp}$ flows through the rectifier G at a pressure of zero. If a pressure P is applied via the point and if this pressure increases, the current I varies as illustrated in FIG. 3.

If, for example, pressure variations acting upon and applied by the point 10 are to be converted to corresponding current variations, said point is made to apply a preliminary pressure $P_o$, which establishes a working point A on the pressure-current curve. At the working point A, the rectifier provides a blocking current $I_o$. If the aforementioned pressure variations are superimposed upon the preliminary pressures $P_o$, corresponding current variations develop around the blocking current $I_o$. That is, the blocking current $I_o$ flows in the circuit with the current variations superimposed upon it.

The working point A may be established in accordance with desired operating conditions. It may be made to lie, for example, in the center of a substantially linearly extending characteristic curve portion so that a substantially linear relationship is provided between the pressure variations of the point and the rectifier current variations. The working point A may also be made to lie on a particularly steep portion of the characteristic curve, if it is desired to transform slight increases of pressure into rectifier current increases which are as large as possible.

Care must be taken that the preliminary pressure P*o* and the superimposed pressures to be measured do not exceed a value at which the rectifier G would plastically deform. The current flowing through the rectifier G then controls the transistor T which produces in its output circuit a current which is increased in magnitude by the current amplification factor of said transistor.

In the embodiment of FIG. 1, it is advantageous to provide the p conductivity type zone 4 of the rectifier upon which the pressure point abuts with a thickness which is so slight that the pressure applied to said zone via the point is transferred at substantially its full magnitude to the p-n junction of said rectifier. It has been found that the current varying effect of the pressure is greater if the pressure is applied to a p-n junction. The pressure may be more readily applied to the p-n junction of the rectifier by providing said p-n junction as a substantially perpendicular line at the surface of the semiconductor block 3. This enables the point 10 to abut the surface of the semiconductor block 3 at the p-n junction of the rectifier or in the immediate vicinity thereof.

Figure 4:
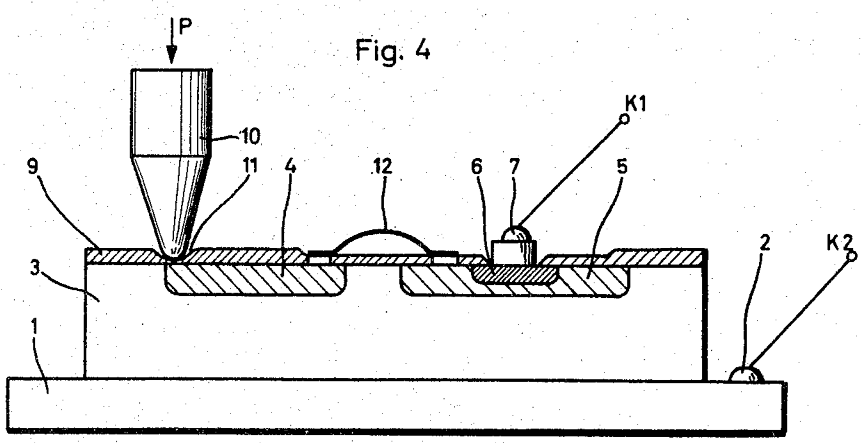
FIG. 4 is a side view, partly in section, of a modification of the embodiment of FIG. 1.

FIG. 4 illustrates a modification of the embodiment of FIG. 1 wherein the point 10 abuts the semiconductor block 3 in the immediate vicinity of or at a p-n junction of the rectifier which is substantially perpendicular to the surface of said semiconductor block. Otherwise, the modification of FIG. 4 is essentially similar to the embodiment of FIG. 1. The p-n junction of the rectifier is formed by the n conductivity type block 3 and the p conductivity type zone 4, and extends to the surface of said n conductivity type semiconductor block. A substantially spherical depression or indentation 11 is formed in the protective coating 9, which covers the semiconductor block 3. The indentation 11 guides the point 10 to the desired pressure application area.

A distinction between the modification of FIG. 4 and the embodiment of FIG. 1, besides that of the indentation 11, is that the electrical connection 12 in FIG. 4 between the zone 4 of the rectifier and the zone 5 of the transistor is a wire contacting both said zones, rather than an electrically conductive layer or layers 8 as in FIG. 1.

Figure 5:
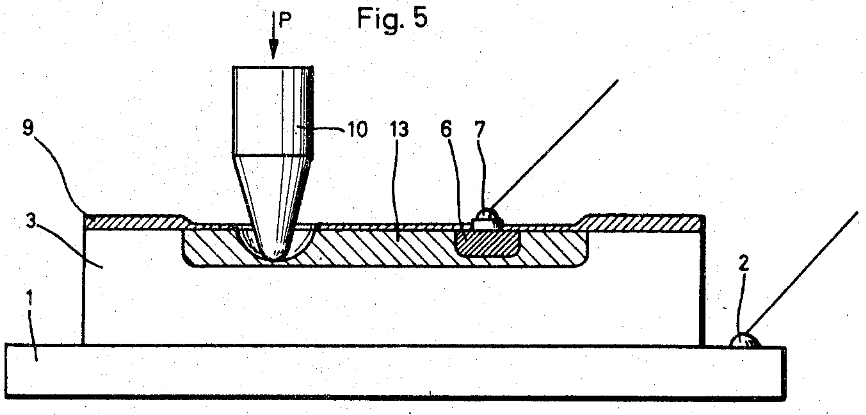
FIG. 5 is a side view, partly in section, of another modification of the embodiment of FIG. 1.

In the modification of FIG. 5, a single zone 13 comprises the rectifier zone and the base zone of the transistor. This eliminates the need for conductive layers 8 as in FIG. 1 or for a conductive wire 12 as in FIG. 4. Otherwise, the modification of FIG. 5 is essentially similar to the embodiment of FIG. 1.

The semiconductor device of the present invention has the advantage that it may be directly connected into a circuit as a bipole rectifier, in which, during variations of pressure applied to and by the point, corresponding current variations are produced. As shown in FIG. 2, the semiconductor device of the invention utilizes two terminals K1 and K2 which are connected to the battery B. Since there are no additional electrodes for the control of the semiconductor device of the present invention, there is no need for additional circuit connections.

The semiconductor device of the present invention may be produced in various, known ways. The transistor and the p-n rectifier may be produced, for example, by alloying the appropriate zones to a semiconductor block. The appropriate zones of the transistor and of the p-n rectifier may also be produced by diffusing-in of acceptor or donor material. Planar techniques may also be utilized.

Obviously, in the illustrated embodiments and modifications, a pnp transistor, rather than an npn transistor, may be utilized. If a pnp transistor is utilized, the n conductivity type zone of the rectifier should lie on the surface of the semiconductor block 3.

The semiconductor device of the present invention may be utilized as a pressure meter. It may also be utilized as a microphone if pressure variations are applied to the point 10 by a membrane M, as shown in FIG. 2.

While the invention has been described by means of a specific example and in specific embodiments, we do not wish to be limited thereto, for obvious modifications will occur to those skilled in the art without departing from the spirit and scope of the invention.

We claim:

1. A semiconductor device, comprising a semiconductor block of determined conductivity type having a surface, a first zone of opposite conductivity type formed in said semiconductor block at said surface thereof and a second zone of opposite conductivity type formed in said semiconductor block at said surface thereof and spaced from said first zone, said semiconductor block and said first zone forming a rectifier;

a third zone of the same conductivity type as said semiconductor block formed in said second zone, said semiconductor block, said second zone and said third zone forming a transistor;

a pressure point abutting the surface of said semiconductor block at said first zone for applying pressure to said first zone; and connecting means for electrically connecting said first zone and said second zone.

2. A semiconductor device as claimed in claim 1, further comprising an electrically non-conductive layer on the surface of said semiconductor block extending from said first zone to said second zone and wherein said connecting means comprises an electrically conductive layer on said electrically non-conductive layer in electrical contact with both of said first and second zones.

3. A semiconductor device as claimed in claim 1, wherein said first zone forms a p-n junction with said semiconductor block and said first zone has a very thin dimension between said p-n junction and the surface of said semiconductor block.

4. A semiconductor device as claimed in claim 1, wherein said first zone forms a p-n junction with said semiconductor block, said pressure point abutting the surface of said semiconductor block at said first zone in near proximity to said p-n junction.

5. A semiconductor device as claimed in claim 4, wherein said p-n junction extends substantially perpendicularly to the surface of said semiconductor block.

6. A semiconductor device as claimed in claim 1, wherein said connecting means comprises an electrically conductive wire connected to said first zone and to said second zone.

7. A semiconductor device, comprising a semiconductor block of determined conductivity type having a surface and a zone of opposite conductivity type formed in said semiconductor block at said surface thereof, said zone providing a first portion and a second portion and said semiconductor block and said first portion forming a rectifier, said first portion and said second portion being spaced from each other;

another zone of the same conductivity type as said semiconductor block formed in the second portion, said semiconductor block, said second portion and said other zone forming a transistor; and a pressure point abutting the surface of said semiconductor block at the first portion for applying pressure to said first portion.

8. A semiconductor device as claimed in claim 7, further comprising an indentation formed in the surface of said semiconductor block in the first portion, and wherein said pressure point abuts the surface of said semiconductor block at said first portion in said indentation.

9. A semiconductor device as claimed in claim 8, wherein said indentation is of semi-spherical configuration.

10. A semiconductor device as claimed in claim 1, further comprising an electrode connected to said third zone and another electrode connected to said semiconductor block.

11. A semiconductor device as claimed in claim 1, further comprising means for providing a current flow through said first zone and said semiconductor block, and wherein said current varies in magnitude in accordance with variations of pressure applied to said first zone through said pressure point.

12. A semiconductor device as claimed in claim 1, wherein a predetermined pressure is applied to said pressure point and variable pressure is simultaneously applied to said pressure point.

13. A semiconductor device as claimed in claim 1, further comprising a pressure-responsive diaphragm coupled to said pressure point.

References Cited by the Examiner

UNITED STATES PATENTS 3,210,620 10/1965 Lin ---------------- 317—235

JOHN W. HUCKERT, *Primary Examiner.*

R. F. POLISSACK, *Assistant Examiner.*